United States Patent [19]

Myron

[11] Patent Number: 4,736,107

[45] Date of Patent: Apr. 5, 1988

[54] ION BEAM IMPLANTER SCAN CONTROL SYSTEM

[75] Inventor: Douglas D. Myron, Austin, Tex.

[73] Assignee: Eaton Corporation, Cleveland, Ohio

[21] Appl. No.: 911,238

[22] Filed: Sep. 24, 1986

[51] Int. Cl.[4] .......................................... H01J 37/302
[52] U.S. Cl. ................................ 250/492.2; 250/492.2
[58] Field of Search ...................... 250/492.21, 492.22

[56] References Cited

U.S. PATENT DOCUMENTS

| | | | |
|---|---|---|---|
| 4,283,631 | 8/1981 | Turner | 250/492.21 |
| 4,421,988 | 12/1983 | Robertson et al. | 250/492.21 |
| 4,449,051 | 5/1984 | Berkowitz | 250/492.21 |
| 4,593,200 | 6/1986 | McGuire, III | 250/492.21 |

OTHER PUBLICATIONS

Vadehra, IBM Technical Disclosure Bulletin, vol. 19, No. 2, Jul. 1976, pp. 449–450.

Primary Examiner—Craig E. Church
Assistant Examiner—Jack I. Berman
Attorney, Agent, or Firm—Watts, Hoffmann, Fisher & Heinke

[57] ABSTRACT

An ion beam implantation system utilizing two pairs of mutually orthogonal scanning electrodes. Two sawtooth waveforms of approximately the same frequency are applied to the scanning electrodes to produce four sided scanning patterns. The dimensions of these scanning patterns are varied to sweep out a scan pattern that uniformly implants a circular wafer. By perturbing the scanning voltages the instantaneous beam speed is adjusted to compensate for small dose nonuniformities.

17 Claims, 14 Drawing Sheets

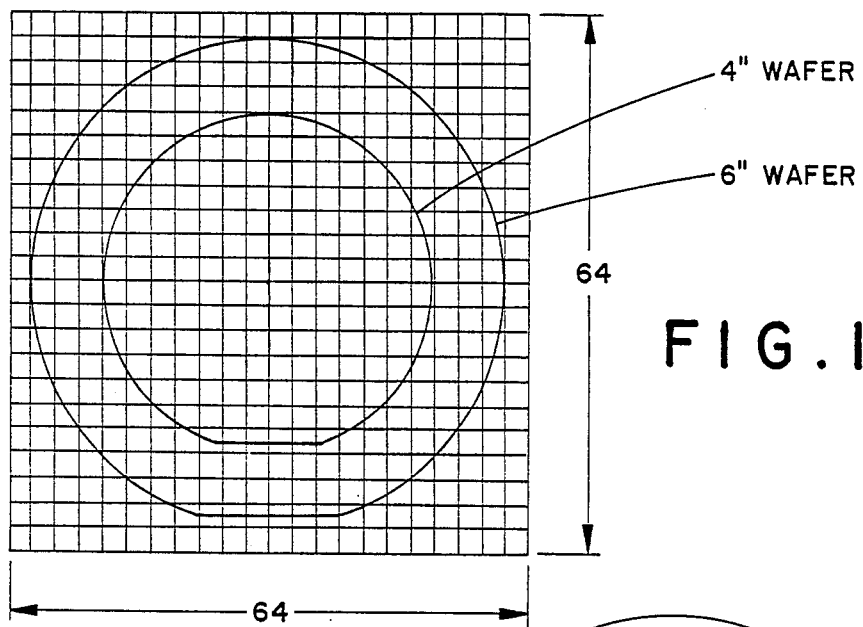
FIG. 13
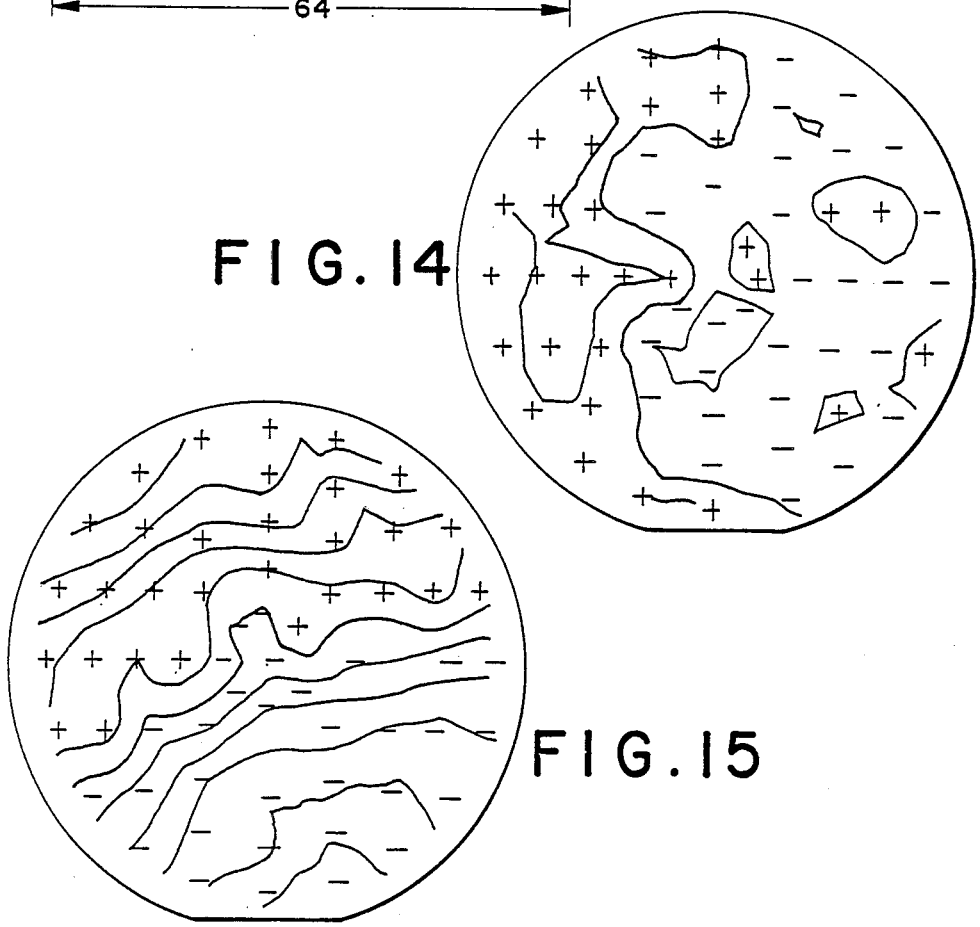
FIG. 14
FIG. 15

ION BEAM IMPLANTER SCAN CONTROL SYSTEM

TECHNICAL FIELD

The present invention relates to an ion beam implantation system and more particularly relates to method and apparatus to scan an ion beam across a target in a controlled trajectory.

BACKGROUND ART

One technique for doping silicon wafers is to direct a beam of ions to impinge upon such a wafer to produce controlled concentrations of doping impurities within the wafer. An important parameter of a semiconductor wafer ion implant processes is the spatial uniformity of the implanted dose across the wafer. Another important parameter is the angle of incidence of the ion beam with respect to the wafer and the internal lattice structure of the silicon crystal (or GaAs lattice or other crystalline substrate). The angle of incidence is important because of the role it plays in the phenomenon of channeling. Dopant depth profiles vary as a function of position on the wafer surface if the incident angle of the beam varies across the surface.

In medium and low current ion implanters the ion beam is commonly directed across the wafer surface by x-y deflection scanning of the beam in a raster or similar pattern. This has commonly been done using two orthogonal pairs of electrostatic deflection plates or electrodes to produce the beam deflections. Application of a triangular waveform voltage to the plates can produce rectangular raster scan patterns on the wafer. U.S. Pat. No. 4,514,637 to Dykstra et al. discloses one such medium to low current ion implanter. The disclosure of Dykstra et al. patent is incorporated herein by reference.

Electrostatic ion beam deflection scanning results in different angles of beam incidence at different locations on the wafer surface. This is the source of a major depth nonuniformity (from the resulting channeling variations) which occurs in this type of implanter.

High current implanters move the wafer through a stationary beam by mechanical means such as attaching the wafers to a spinning disk passing through the beam or by other well known mechanical scanning techniques. These mechanical scanners have tended to be designed so that as the wafer moves through the ion beam, the angle of beam incidence remains constant or nearly so. For this reason mechanical scanning of wafers through a stationary beam has come to be considered as a superior method to x-y deflection of the beam for producing depth uniformity and minimum mask shadows variation.

Batch wafer handling imposed by the high current ion beam techniques have generally resulted, however, in reduced wafer throughput and required large costly wafer handling stations. Deflection scanning machines on the other hand have advantages in size, simplicity, and cost but suffer from varying angle of beam incidence problems.

To help eliminate the effects of channeling, the wafer is tilted at an angle relative to the incident beam. The wafer tilt causes the beam velocity to be lower (higher dose) for areas of the wafer closer to the source and beam velocities to be higher (lower dose) for areas of the wafer farther from the source.

Traditional deflection systems use a high frequency scan in one direction and a low frequency scan in an orthogonal direction to sweep across a circular semiconductor wafer. The relationship between the low and high scan frequencies are selected to produce a highly interlaced lissajous pattern. The scan pattern produced at the target is rectangular or square and results in scan inefficiencies because of beam portions that overscan the circular wafer. This square pattern generated by the combination of high and low frequency scan signals necessitates two visual displays for beam tuning and centering. One low frequency sweep display is in sync with the low frequency beam scan signal and one high frequency sweep display is in sync with the high frequency beam scan signal. Experience with this type of beam tuning indicates that is may not accurately center the beam on the workpiece.

DISCLOSURE OF INVENTION

The present invention provides a highly efficient ion beam scan for implanting semiconductor wafers. The disclosed scanning procedure results in highly uniform dose concentrations and includes compensation for the tilting of the semiconductor wafer.

An ion implant system of the invention includes a source for providing ions to treat the workpiece and a support for orienting the workpiece at a location relative to the source. Beam forming apparatus shapes the ions into a well defined ion beam moving with a specified energy along a trajectory that causes the ion beam to impinge upon a region of the workpiece. In the preferred embodiment of the invention the workpiece is a generally circular semiconductor wafer and the initial trajectory of the beam causes the beam to impinge upon a center location of the wafer.

A scanning system bends the ion beam away from this initial trajectory so that it impinges upon other regions of the workpiece to implant ions across the surface of the workpiece. The scanning system includes one or more field creating electrodes coupled to a control circuit that generates control voltages to effect the preferred scanning.

The control circuit includes a storage device that stores signals corresponding to a sequence of voltages suitable for bending the beam in a controlled scan pattern. These signals are transmitted to a conversion device such as a digital to analog converter that converts the values stored in the storage device to a time varying voltage output that is coupled to the scanning electrodes. A compensation circuit adjusts the time varying voltage applied to the scanning electrode to adjust the instantaneous ion dose as the ion beam scans across the workpiece.

A preferred storage device is a programmable read only memory (PROM) that stores signals that define a preferred scanning pattern. These signals correspond to deflection voltages which in turn generally correspond to coordinate locations in the plane of the semiconductor wafer. Stated another way, each pair of signals stored in the PROM, can be converted to a pair of deflection scanning voltages which deflect the ion beam away from the initial trajectory to a coordinate location in the plane of the semiconductor wafer.

The preferred scanning system uses pairs of deflection electrodes or plates oriented at right angles to each other so that a first pair of electrodes deflects the beam in one direction and a second pair of electrodes deflects the beam in an orthogonal direction. In this system separate scanning voltage generators are used for each of the pair of scanning electrodes One scanning electrode control circuit coordinates the ion beam scanning and operates as master circuit and the other scanning electrode control circuit responds to and therefore is a slave to the first.

The scanning pattern stored in the memory defines a beam deflection sequence that sweeps out foursided figures having corners beyond the surface of the wafer. Between these corners, the ion beam scans across the surface of the wafer implanting ions in a controlled manner. The four sided scanning pattern is varied with time so that the entire surface of the wafer is treated.

To make the ion implantation dose more uniform, a dither voltage is applied to one set of scanning electrodes. This dither voltage shifts the pattern of rectangular scanning to improve spacial resolution of the implant and dose uniformities caused by small beam geometrics.

To take into account the tilting of the semiconductor wafer and thereby avoid dose non-uniformity due to wafer tilt, the scanning control circuits perturb the scanning voltage. As the ion beam sweeps across the workpiece it is speeded up and slowed down to compensate for the wafer tilt.

The perturbation process to compensate for wafer tilt has other applications. This perturbation can correct for systematic and perhaps unexplained dose nonuniformities. This produces higher yields in semiconductor fabrication which should more than counteract the somewhat increased cost of the more sophisticated scanning electronics.

The dose correction is accomplished with a look-up table. The instantaneous scan voltages on the two orthogonal scanning electrodes are used as an index into the lookup table. The combination of scan voltages points to a single value which is added to or subtracted from the scan voltage. The normal sweep voltages that are applied to the scanning electrodes are slightly perturbed and result in small, controlled variations in ion beam dose.

The method and apparatus of the invention have other advantages. The scanning frequency of the two electrodes is approximately the same. Thus, the two scan amplifiers are the same resulting in a commonality of parts and maintenance. A single video monitor can be used to shape and oenter the ion beam. Further, because the scanning pattern is octogonal scanning efficiency is increased for a circular workpiece.

From the above it is appreciated that one object of the invention is an improved, more uniform ion beam scanning technique for use with an ion implantation system. This and other objects, advantages and features of the invention will become better understood from a review of a detailed description of a preferred embodiment of the invention which is discussed in conjunction with the accompanying drawings.

BRIEF DESCRIPTION OF DRAWINGS

FIG. 13 shows an organization of a dose correction look-up table scan dose;

FIGS. 14 and 15 are plots of dose uniformity across the surface circular target wafer.

BEST MODE FOR CARRYING OUT INVENTION

Figure 1:
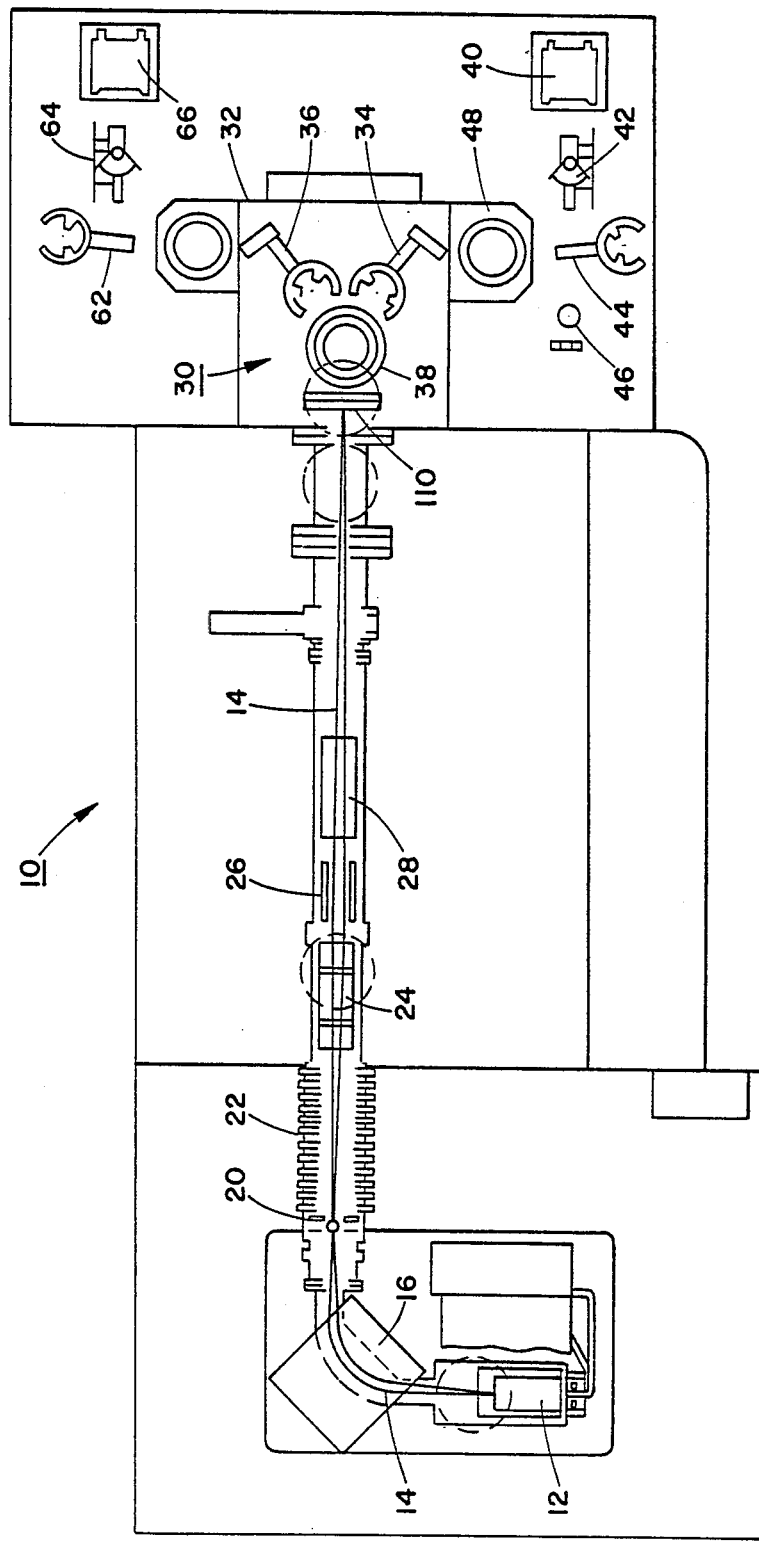
FIG. 1 is a schematic overview of an ion implantation system utilizing scanning electrodes for directing an ion beam to the surface of a workpiece.

Turning now to the drawings, an ion implantation system 10 is illustrated having an ion source 12 for directing an ion beam 14 to an ion mass analyzing magnet 16 which bends the beam at right angles and directs the beam along an elongated travel path through a beam shutter 20 and accelerating electrodes 22. Downstream from the accelerating electrodes 22, the beam passes through a quadruple lens system 24 that focuses the beam. The beam 14 then passes through two pairs of deflection electrodes 26, 28. Control voltages applied to these electrodes 26, 28 create electric fields which deflect the ion beam 14. The deflected ion beam is then directed to an ion implantation station 30 where a generally circular silicon wafer 110 is positioned in the beam path. By modulating the scanning voltages applied to the scanning electrodes 26, 28, the beam 14 is scanned across the wafer.

The ion implantation station 30 is located in an evacuated chamber 32. Two arms 34, 36 mounted within the chamber 32 automatically load and unload wafers to and from a wafer support 38. Undoped silicon wafers are retrived from a cassette 40 by a shuttle 42 which brings a single wafer to the vicinity of an arm 44 which moves the undoped wafer to an orienter 46. The orienter rotates the undoped wafer to a particular crystal orientation. The arm 44 retrieves the suitably oriented wafer and moves it into a loading station 48 next to the evacuated chamber 32. The loading station 48 closes, is pumped down to vacuum, and opens into the chamber 32. The arm 34 grasps the wafer, brings it within the chamber and places it on the support 38 at a load/unload position. The support includes a mechanism to first clamp the wafer and then pivot the wafer to a vertical orientation with a wafer surface facing the ion beam 14.

On the unload side of the chamber 32, the second arm 36 grasps a doped wafer from the support 38, and removes it from the chamber 32. An arm 62 moves the wafer to a shuttle 64 which automatically places the wafer into a second cassette 66.

Application of suitable energization voltages to the deflection electrodes 26, 28 causes the beam to deflect away from its initial trajectory to scan or sweep across a vertically oriented wafer at the ion implantation station 30. In one prior art ion implantation system energization voltages are simultaneously applied to the electrodes 26, 28 to create a scan pattern 100 depicted in FIG. 2. The ion beam scans across a circular target wafer 110 in an zigzag pattern.

Figure 2:
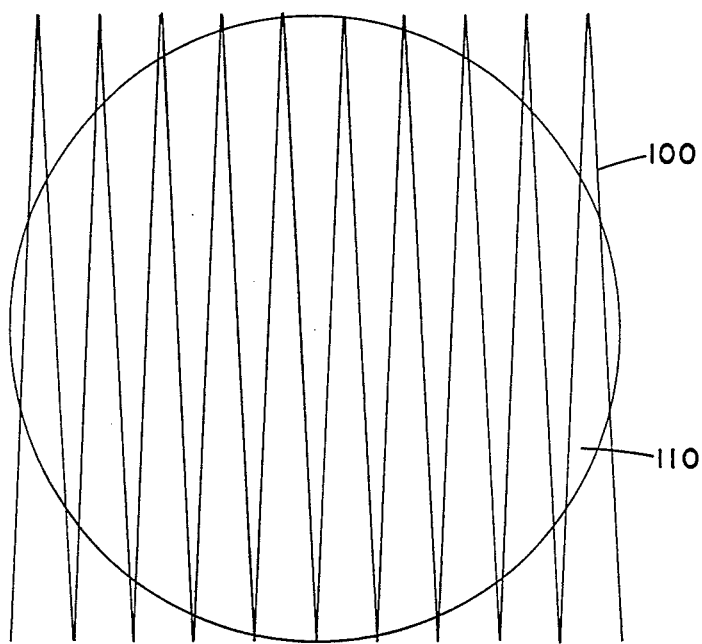
FIG. 2 shows a prior art ion beam scanning technique that results in scanning inefficiencies due to ion beam overscan.

To accomplish the zigzag pattern 100 of FIG. 2, it is necessary that a relatively slow time varying signal be applied to the horizontal deflection electrodes 26 and that a higher frequency sawtooth waveform be applied to the vertical deflection electrodes 28. This causes the ion beam 14 to sweep from side to side at a low frequency and up and down with a high frequency resulting in the scan pattern 100 of FIG. 2.

To sweep out a uniform pattern and produce relatively uniform ion doping, one prior art beam treatment proposal offsets the horizontal scan for each scan iteration. As more iterations are completed, ion implantation across the workpiece surface becomes uniform and fills in the gaps between the ion beam pattern 100 of FIG. 2.

Figure 3:
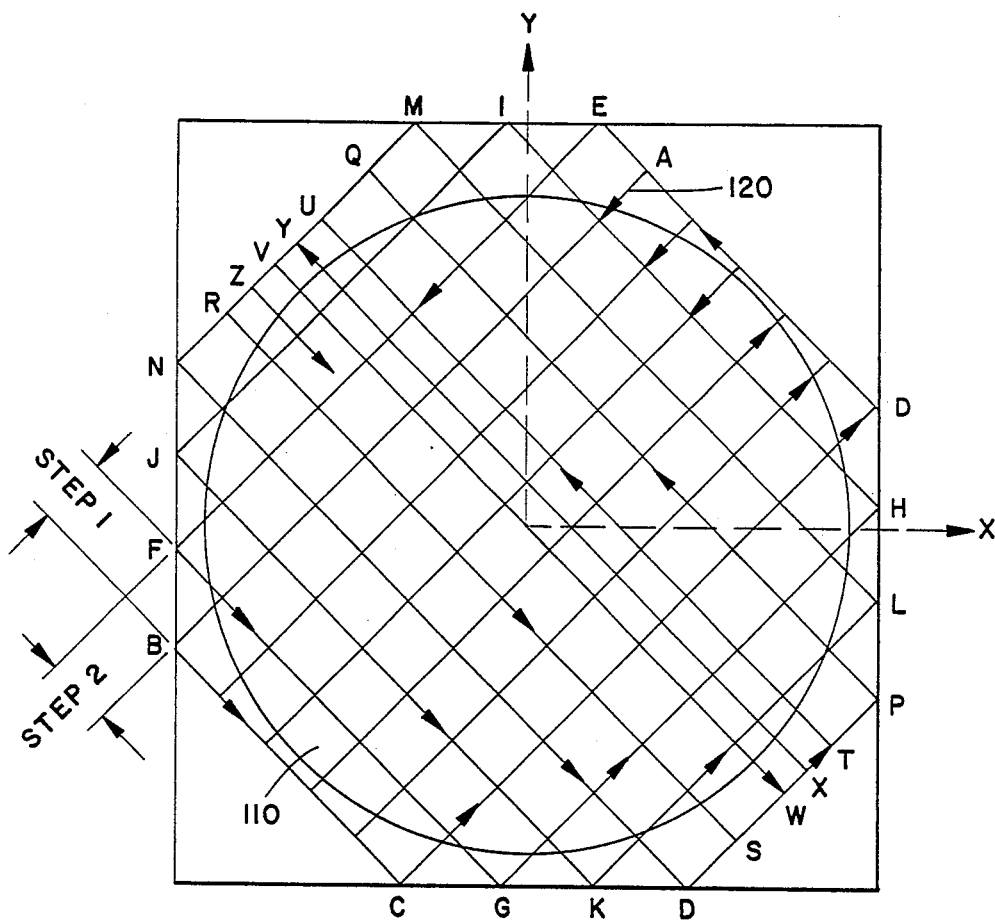
FIG. 3 shows an ion beam scanning procedure in accordance with the present invention that results in less overscan and therefore more efficient ion beam utilization.

Turning now to FIG. 3, a new and improved scan pattern 120 is illustrated. As will become apparent below, this scanning pattern is accomplished by controlled deflection of the ion beam 14 utilizing vertical and horizontal electrode energizing waveforms (FIGS. 6 and 8) of approximately the same frequency. The scan pattern 120 of FIG. 3 is delineated by the reference designators A–Z. Each of these designators refers to a region of the ion beam scanning pattern where the ion beam 14 changes directions at generally right angles. Each of these regions is located off the circular wafer 110 and therefore the ion beam sweeps a straight line path or segment across the wafer during ion implantation.

Figure 4:
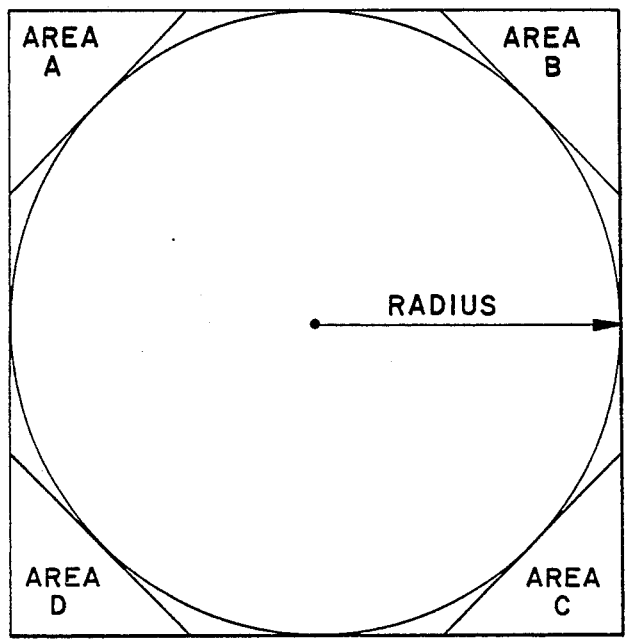
FIG. 4 is a schematic representation comparing the degree of overscan accompanying the prior art scanning of FIG. 2 with the FIG. 3 scanning in accordance with the invention.

One advantage of the invention is seen by reference to FIG. 4 where the overscan portions of the prior art (FIG. 2) are compared with the overscan portions of the scan pattern 120 of FIG. 3. In the prior art, the scan pattern 100 sweeps out a generally four sided figure including the areas labeled area A, area B, area C, and area D of FIG. 4. As the ion beam 14 scans across these regions, no ion implantation of the wafer 110 takes place. The new scanning pattern 120 (FIG. 3) of the invention, sweeps out a generally eight sided figure but does not sweep across the regions designated areas A–D.

Figure 7:
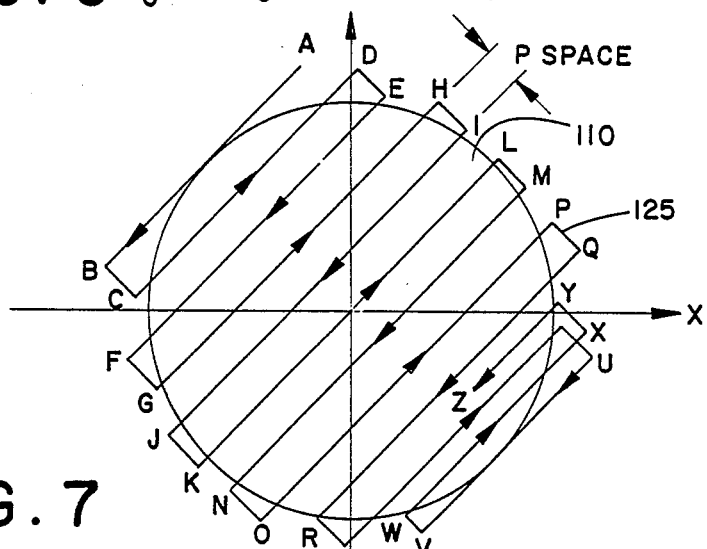
FIG. 7 is an alternate improved ion beam scanning pattern for use with an ion implantation system.

A second scan pattern 125 that is more efficient than the scan pattern of FIG. 2 is depicted in FIG. 7. In the FIG. 7 scanning pattern, the ion beam begins the scan at point A and traverses the wafer 110 in diagonal sweeps terminating at the point V. At this location, a next subsequent scan of the workpiece is initiated by a small beam deflection to the point W followed by scan segments defined by the points X, Y, etc. As seen in FIG. 7, the ion beam overscans the workpiece much less than the prior art scan of FIG. 2. The efficient scanning achieved in FIG. 3 will be referenced as an octagonal scan pattern and the scanning pattern of FIG. 7 will be referred to as a quasi-circular pattern.

Figure 12:
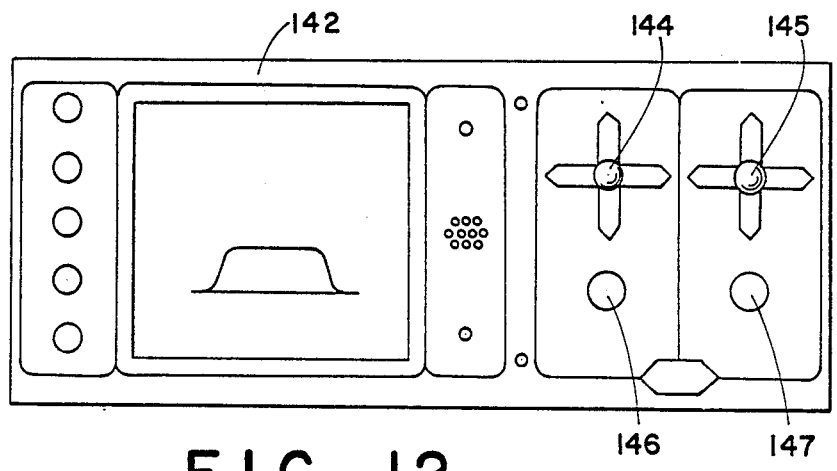
FIG. 12 is an elevation view of a display screen to aid a system operator in tuning and centering the ion beam with respect to a semiconductor wafer.
Figure 5:
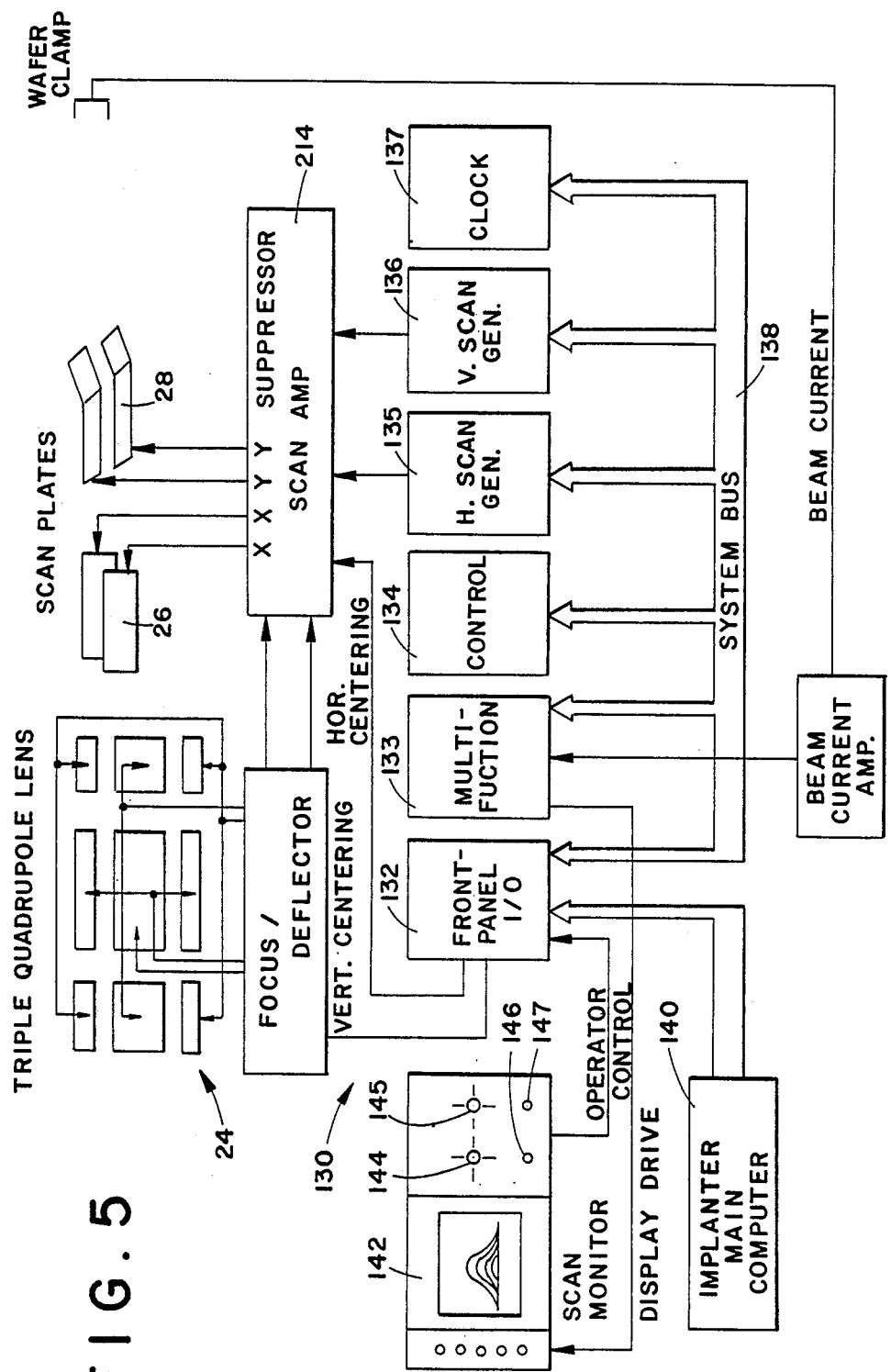
FIG. 5 is a schematic diagram of scanning circuitry for energizing deflection electrodes of the ion implantation system.

Turning now to FIG. 5, a beam scanning system 130 for applying energization voltages to the horizontal and vertical deflection electrodes 26, 28 is illustrated. The system 130 includes a number of modular circuits 132–137 that interface with a system bus 138. A system clock circuit 137 generates timing signals to coordinate operation of the other circuits of the scanning system 130. A control circuit 134 includes a microprocessor and operating system stored in memory. A computer 140 coupled to a front panel interface circuit 132 displays additional ion implantation system information on a conventional computer terminal (not shown) coupled to the front panel circuit 132. A special cathode ray viewing monitor 142 is used to control beam focusing and to center the ion beam prior to beam treatment of the target wafers. By viewing the monitor 142 a system operator can evaluate the centering and focusing of the ion beam. Beam focus and centering controls 144–147 (FIG. 12) are positioned to the side of the monitor 142 to allow the user to adjust voltages coupled to a quadruple lens system 24 that shapes the beam 14 and also adjust the position and size of the beam scan pattern on the wafer 110.

Figure 6:
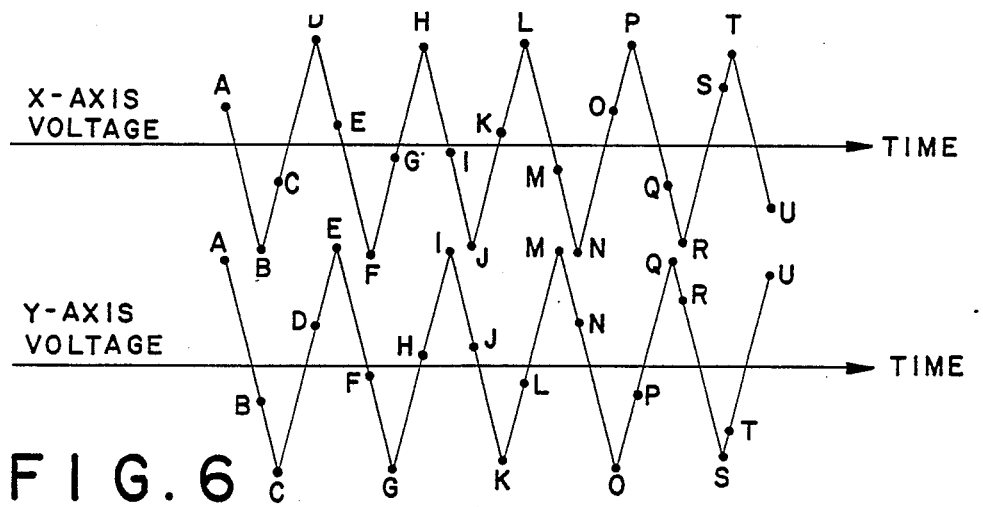
FIG. 6 are voltage waveforms applied to horizontal and vertical deflection electrodes for producing the FIG. 3 pattern.
Figure 8:
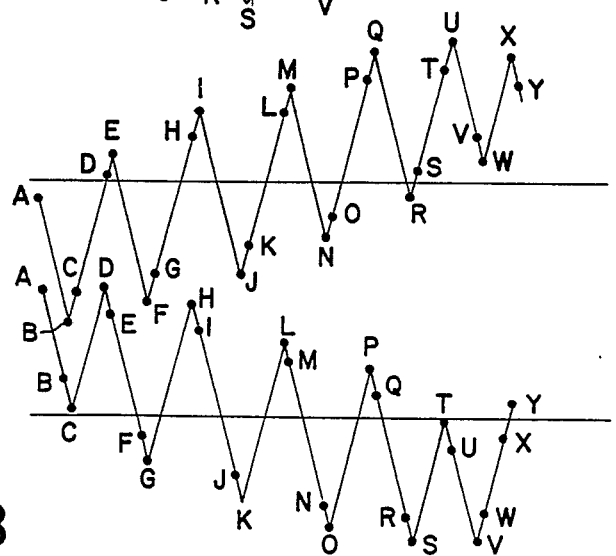
FIG. 8 illustrates voltage waveforms suitable for energizing deflection electrodes to produce the FIG. 7 scanning pattern.

Horizontal and vertical scan generator circuits 135, 136 generate voltage waveforms depicted in FIGS. 6 and 8. FIG. 6 depicts a time varying voltage difference across the horizontal and vertical deflection electrodes 26, 28 to produce the FIG. 3 scanning pattern 120. FIG. 8 depicts the time varying voltage across the horizontal and vertical deflection electrodes 26, 28 to produce the FIG. 7 scanning pattern 125. The reference characters A–U shown on the two voltage waveforms in the FIGS. 6 and 8 correspond to ion beam scanning locations A–U in the plane of the wafer 110 depicted in FIGS. 3 and 7.

It is seen by referring to FIG. 6, that the scanning wave pattern 120 of FIG. 3 is accomplished by applying two sawtooth deflection voltages of approximately the same frequency across the horizontal and vertical scanning electrodes 26, 28. Specifically, the ion beam is deflected to point A (FIG. 3) by the application of a first deflection voltage to the horizontal deflection plates 26 and a second larger deflection voltage to the vertical electrodes 28. To scan the ion beam 14 away from point A, both X and Y deflection voltages decrease. The ion beam 14 scans diagonally across the wafer and crosses the Y axis in FIG. 3 at a point above the X axis. The ion beam continues to scan diagonally away from point A in FIG. 3 until the ion beam 14 has swept completely across the wafer 110 and reaches the point designated B in FIG. 3. At this point, the scan pattern 120 has reached a maximum negative horizontal deflection. A right angle bend in the ion sweeping pattern 120 is achieved at point B when the horizontal deflection voltage reverses (FIG. 6) as the voltage applied to the vertical electrode 28 continues to ramp downward. The ion beam 14 changes direction (Point B) off the wafer surface and scans in close proximity to an edge of the wafer to a region designated C in FIG. 3. At this location, the vertical scan voltage reverses direction while the horizontal scanning voltage continues to increase. Scanning continues in diagonal segments until point U has been reached in the pattern 120.

The initial portions of the scan 120, i.e., the scanning segments connected by points A–U represent a small portion of a complete ion beam scanning of the wafer 110. Each four segments of this portion define a four sided figure and at least two parallel sides of each four sided figure scan in opposite directions across the wafer 110.

Although in FIG. 3 depiction of the scanning pattern 120 the ion beam has been indicated as a line having no width, the actual width of the scanning beam 14 can vary from one to five centimeters and is influenced by the quadrapole bus, beam current, and beam energy. The beam has a maximum intensity in the center of the beam coincident with the path segments depicted in FIG. 3. Scanning continues beyond point Z (FIG. 3) to fill in gaps in scanning coverage. In accordance with a preferred embodiment of the invention, a particular wafer scan has over 4000 scan segments beginning at point A. These 4000 segments constitute what will be referred to as a fine frame that takes approximately 65 milliseconds to complete. A complete ion implantation sequence takes 10–15 seconds and therefore requires hundreds of iterations of these fine frames.

In the quasi-circular scanning pattern 125 of FIG. 7, a different scanning approach is chosen. Horizontal and vertical scanning voltages for producing this scan pattern 125 are depicted in FIG. 8. Each waveform is defined by the end points of the sawtooth waveforms coupled to the two pair of horizontal and vertical scanning electrodes 26, 28. The designations A-Y in FIG. 8 correspond to the regions designated A-Y of the scan pattern of FIG. 7.

Figure 9:
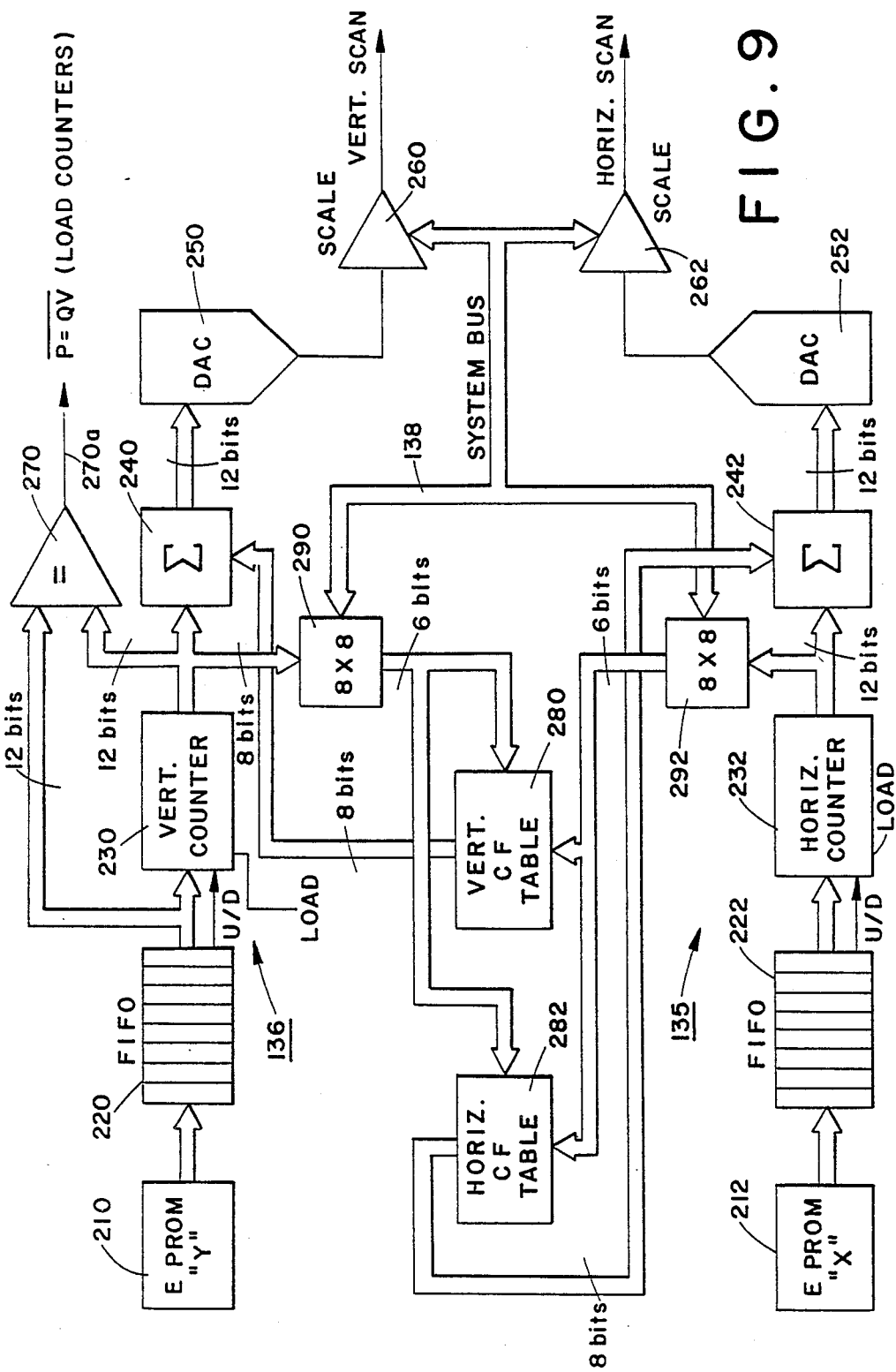
FIGS. 9–11 schematically illustrate scan control and dose correction circuitry for use with the invention.
Figure 11:
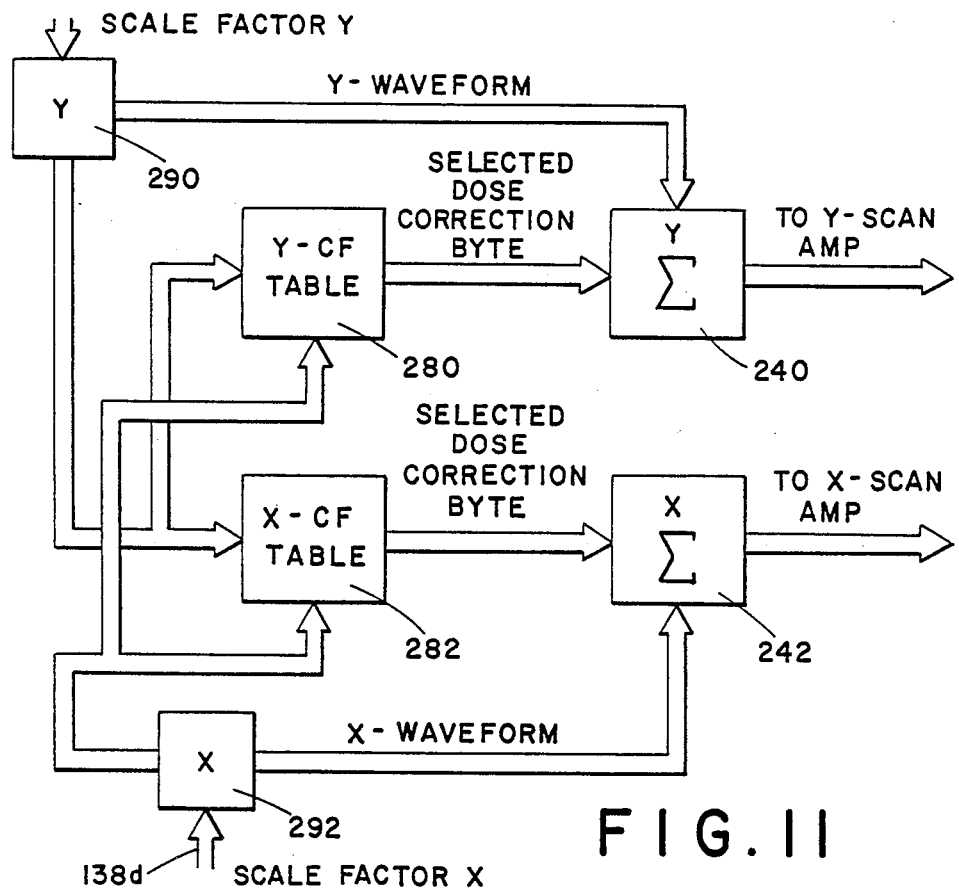

FIG. 9 illustrates components of the horizontal and vertical scan generator circuits 135, 136 that produce the waveforms of FIGS. 6 and 8. Electronically programmable read only memory units 210, 212 store 16 bit signals designating the positions of the end point locations A, B, C, D, etc. defining the scanning patterns of FIGS. 3 and 7. The remaining circuitry in FIG. 9 converts these end points into a ramp voltage that is coupled to an amplifier interface 214 (FIG. 10) between the FIG. 9 circuits and the scan electrodes 26, 28.

Figure 10:
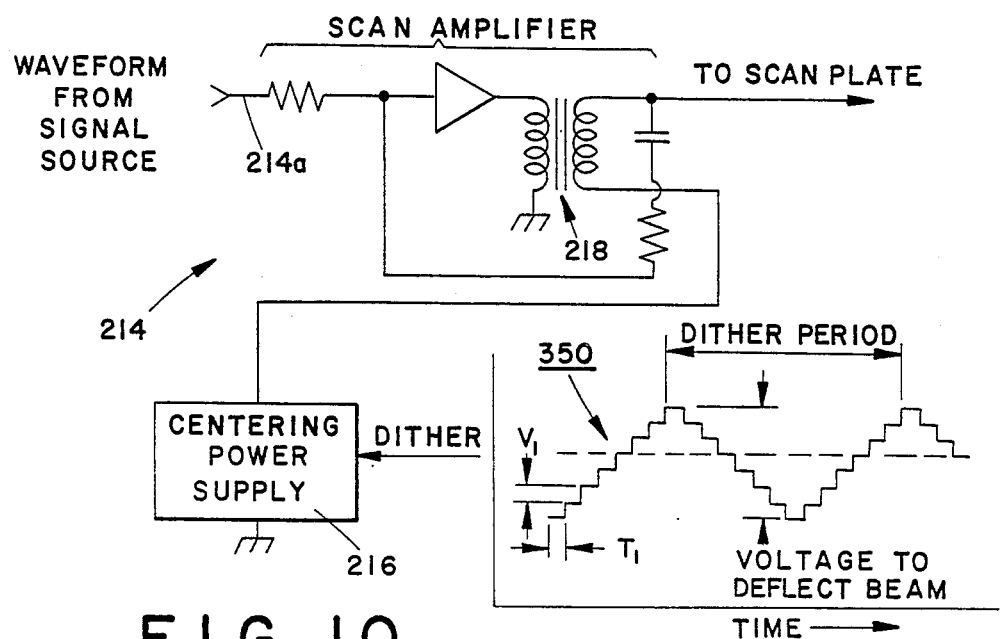
Figure 16:
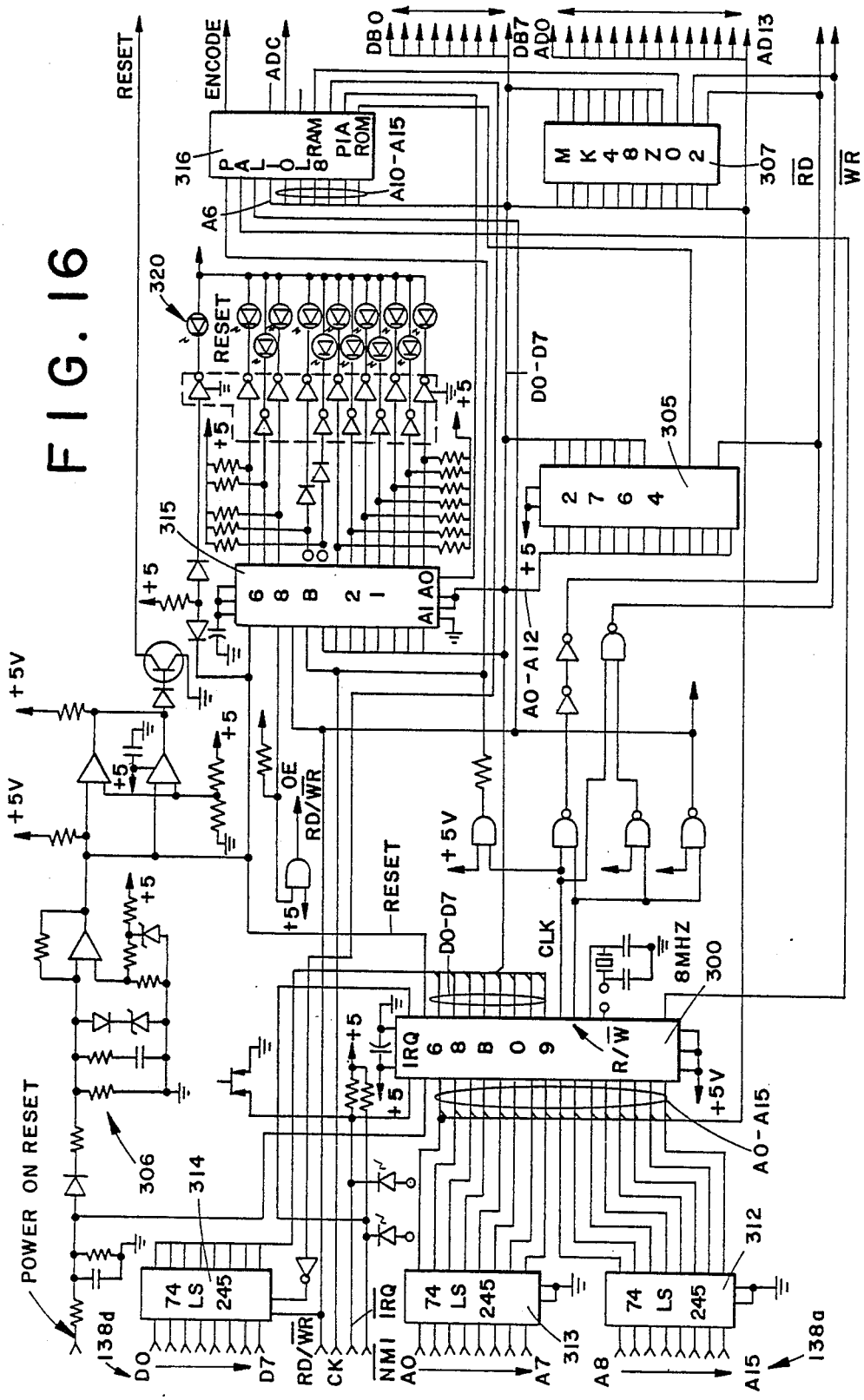
FIGS. 16–19 illustrate more detailed schematics of the vertical and horizontal scan electronics depicted in FIGS. 9–11.

The interface 214 receives as an analog signal from the FIG. 9 scan circuitry and couples that signal to a high voltage power supply 216 through a transformer 218. A sawtooth waveform appearing at an input 214a to the interface 214 is therefore coupled across a pair of scanning plates and is added or subtracted from a d.c. centering voltage from the power supply 216. Although only one interface 214 is shown in FIG. 10, it is appreciated that one interface is needed for the horizontal electrodes 26 and a second is needed for the vertical electrodes 28.

Returning to FIG. 9, signals stored in the memories 210, 212 indicating the end points of the waveforms (FIG. 6 for example) are loaded under control of the control circuit 134 into 16 bit wide by 32 word long first in, first out (FIFO) buffer memories 220, 222. One buffer 220 stores absolute end points for the vertical deflection voltage and a second buffer 222 stores end points for the horizontal deflection voltage. The process of loading end point data takes place at a high rate of speed until each of the memories 220, 222 is full. After the memories 220, 222 are loaded, a first entry in each memory is loaded into a corresponding 12 bit digital counter 230, 232. One counter 230 generates a digital value corresponding to a vertical scan voltage and the second counter 232 generates a digital value corresponding to a horizontal scan voltage. Both counters are activated simultaneously and begin clocking either up or down depending upon the status of an UP/DOWN bit of the word presented at the output from the FIFO memories 220,222.

By referring to FIG. 6 it is seen that the initial vector offsets designated A in FIG. 3 require the two counters to begin counting down at a constant rate to produce the diagonal scanning segment extending from point A to B in the FIG. 3 scan pattern. To achieve this counting, both counters are clocked at the same rate by a common clock signal from the clock circuit 137.

Twelve bit outputs from the two counters 230, 232 are coupled to two summing circuits 240, 242. These circuits add or subtract a correction factor to the output from the two counters 230, 232 and will be discussed in more detail below. The modified output from the counters is then transmitted to digital-to-analog converters 250, 252. The output of these digital to analog converters follows the output of their respective counters 230, 232 and is filtered or smoothed by the bandwidth limited scan amplifier.

Scaling circuits 260, 262 attenuate the output from the first digital to analog converters 250, 252 to provide vertical and horizontal scan signals. Outputs from the scaling circuits 260, 262 are coupled to a scan electrode interface 214 which in turn is coupled to a high voltage sawtooth waveform to the deflection electrodes 26, 28. As mentioned above, each pair of the deflection plates 26, 28 has its own scan interface circuit 214 and the FIG. 10 depiction is illustrative of only one of such circuits.

The vertical scan circuit 136 operates as a master to the slave horizontal scan circuit 135. It is seen in FIG. 9 that an output from the vertical counter 230 is coupled to a digital comparator circuit 270 which is also coupled to an output from the memory FIFO 220. Each time the vector locations for the end points of the FIG. 3 scan are loaded from the memory 220 to the counter 230, a next subsequent vector is presented at the output of the memory 220. This digital signal is coupled as one input to the comparator 270 so that when the output from the counter 230 reaches this next end point vector, an output signal 270a from the comparator 270 clocks a next end point into only the horizontal counter 232 since the vertical counter is at the next end point.

Since the clock rate of both counters is the same, diagonal scanning takes place for each scan segment of the FIG. 3 scan. When the vertical counter 230 reaches an end point vector, the horizontal counter 232 also reaches that end point.

Reaching a vector end point indicates at least one of the two counters must begin counting in an opposite direction. This is controlled by the UP/DOWN bit of the sixteen bit output from the memory units 220, 222. Generation of the scan signals at the digital-to-analog converter outputs 260a, 262a continues until most but not all the words stored in the FIFO memories 220, 222 are depleted. A signal is generated by the control circuit 134 causing a high speed data transfer from the two PROM memories 210, 212 into the FIFO memories 220, 222.

The output from the two counters 230, 232 is modified by the summing circuits 240, 242. This modification provides a dose control that can be utilized, for example, to correct for dose nonuniformities caused by wafer tilt introduced to avoid channeling effects. In accordance with one procedure, the wafer target 110 is tilted approximately 7° about a horizontal axis (X). This wafer tilt causes the ion beam to travel a slightly longer distance to reach the upper half of the wafer than the lower half. The ion beam velocity is lower for regions of the wafer closer to the source and produces a higher ion dose. The ion beam velocity is higher for regions of the wafer further from the source resulting in lower ion dose. To compensate for this beam tilt, or any other ion beam dose irregularity, a correction is added to (or subtracted from) the output from the two counters 230, 232. The correction depends upon the position the scanning beam occupies in the scan of FIG. 3 and is calculated utilizing two digital look-up tables 280, 282, one for the vertical counter and a second for the horizontal counter.

FIG. 13 shows the organization of one of the dose compensation look-up tables. This look-up table is divided into a 64×64 matrix of zones for a total of 4096 dose correction zones per look-up table. Outlines of two wafers (6 inch and 4 inch) are superimposed over this matrix to indicate the dose correction factor at each matrix location is related to the position of the ion beam on the wafer 110. The instantaneous output from the two counters 230, 232 is used as an index to the look-up table for determination of a dose correction factor to either be added to or subtracted from the output from the counters 230, 232. As indicated in FIG. 9, the vertical look-up table 280 is accessed for correction factors to be added to or subtracted from the output of the counter 230 and the look-up table 282 modifies the output from the counter 232.

Interposed between the output from the counters and the look-up tables 280, 282 are two scaling circuits 290, 292. Scaling factors are loaded into these circuits 290, 292 from a system data bus 138d. The use of this scaling allows a single look-up table to be used for different sized wafers. A six inch diameter wafer is schematically depicted in relation to the data format of FIG. 13. For ion implantation of a four inch wafer, the deflection voltages are attenuated to scale down the scanning pattern.

The same correction factor look-up tables 280, 282, however, are utilized for a four inch wafer, but since the scanning is attenuated to cover a smaller wafer, the counter output from the two counters 230, 232 must also be scaled by a factor relating to beam energy and maximum beam deflection to determine an index into the two look-up tables 280, 282.

As the ion acceleration energy changes, if the scan voltage is kept constant the amount of beam deflection is inversely proportional to the acceleration energy. This dependency of beam deflection with beam energy can be taken into account by adjusting the scaling factor presented on the system data bus 138d. The counters 230, 240 generate 12 bit signals, all twelve of which are coupled to the adders 240, 242. A high eight bits of the counter output form inputs to the scaling circuits 290, 292. When this counter output is multiplied by an eight bit scaling factor from the data bus 138d, a sixteen bit result is generated. The six most significant bits of this product are utilized as index inputs to the horizontal and vertical dose correction look-up tables 280, 282. Six bit outputs from two scaling circuits index into the look-up tables 280, 282 and uniquely designate one of the 64×64 dose correction elements in each look-up table. An eight bit correction factor is output from the look-up tables 280, 282 and added to the counter outputs by the digital adders 240, 242. It is this compensated or corrected value and not the counter output that is converted to an analog output by the digital-to-analog converters 250, 252.

When the compensation factors are added the waveforms of FIGS. 6 and 8 are modified or perturbed to either speed up or slow down the ion beam as it scans the wafer. This controls beam dose and compensates for wafer tilt. In one dose correction table the correction factor varies quadratically as a function of beam deflection away from the horizontal axis, i.e., the axis about which the wafer is tilted.

The look-up tables 280, 282 are electrically programmable memory units whose contents can be programmed and therefore altered depending upon the specific correction factor required and in particular can be adjusted for different amounts of wafer tilt. In one embodiment of the invention, wherein the tilting of the wafer 110 is about a horizontal axis and no horizontal correction is required, the horizontal look-up table 282 is filled with zeros. In this embodiment, the vertical correction table 280 contains constants in each of its 4096 memory locations to either increase or decrease the scanning waveform voltage output from the digital-to-analog converter 250 to compensate for dose nonuniformities from an ion beam impinging upon a tilted wafer. Where the correction table 282 is filled with zeros, the adder 242 does not change the output from the horizontal counter 232 and the only modification of the output from the ditigal-to-analog converter 252 occurs due to the scaling factors applied by the digital-to-analog converter 262.

FIGS. 14 and 15 illustrate dose uniformities for a five inch wafer implanted with a 7° tilt and a 22.5° rotation both with and without correction factors. The top half of the wafer is tilted away from the scan plates 26, 28. The FIGS. 14 and 15 plots are of sheet resistivity of the implanted wafer. A minus sign indicates a lower than average resistivity corresponding to a slightly higher dose than average. A positive sign indicates a higher sheet resistivity caused by a lower dose.

The implanted wafer of FIG. 14 utilizing correction factors stored in the vertical look-up table 280 shows a significant improvement in dose uniformity. In the FIG. 15 representation, the lines of equal resistivity are closely spaced indicating a relatively high resistivity gradient across the wafer surface. The regions of high and low resistivity run parallel to a wafer centerline. In the FIG. 14 depiction, the lines of equal resistivity are spaced apart and are fewer in number, indicating a lower gradient across the wafer surface.

The scale factor applied by the circuits 260, 262 is different than the scale factor applied by the two circuits 290, 292. The circuits 290, 292 help calculate beam position based upon beam energy and amount of deflection. The circuits 260, 262 control the amount of beam overscan to determine the size of the patterns of FIGS. 3 and 7. Since the circuits 290, 292, 260, 262 are unique addresses on the bus 138, different scaling factors are presented and latched into the circuits based upon these addresses. The use of these scaling circuits 290, 292, 260, 262 makes the system 10 automatically adjust for different wafer sizes and this variable need not be entered by the user. The system operator instead adjusts the monitor 142 to achieve a display signature of a properly centered correctly overscanned beam. In this regard a beam centering and overscan control system is disclosed in a copending patent application Ser. No. 911,240 entitled "Ion Beam Implantation Display Method and Apparatus" to Myron, filed concurrently herewith and incorporated herein by reference.

FIGS. 16–19 present detailed schematics of the vertical scan generator circuit 136 of FIG. 9. In addition, portions of a control circuit 134 are depicted. The control circuit 134 includes a microprocessor 300 (FIG. 16) executing an operating system computer program stored in a non-volatile read only memory 305. On power up of the system, a reset circuit 306 generates a reset to the microprocessor 300 causing the program stored in the memory 305 to be executed. During execution of the operating system the microprocessor 300 uses a RAM memory 307 to store values used in calculations.

The microprocessor 300 is an eight bit microprocessor clocked at a rate of 2 Megahertz and having input and output connections forming an eight bit data bus 138d and a 16 bit address bus 138a. These two bus systems are designated as DB0-DB7 (data) and AD-AD15 (address) in FIG. 16. Multiple interface circuits 312-316 are coupled to the microprocessor, address and data buses. Three circuits 312-314 comprise line drivers to boost power outputs on the buses 318a, 318d. One interface circuit 315 is a peripheral interface adaptor for driving an array of diagnostic light emitting diodes 320 to display the status of the system. The circuit 316 is an address decoder for enabling reading data from and writing data into the memory circuits 305, 307.

Figure 17A:
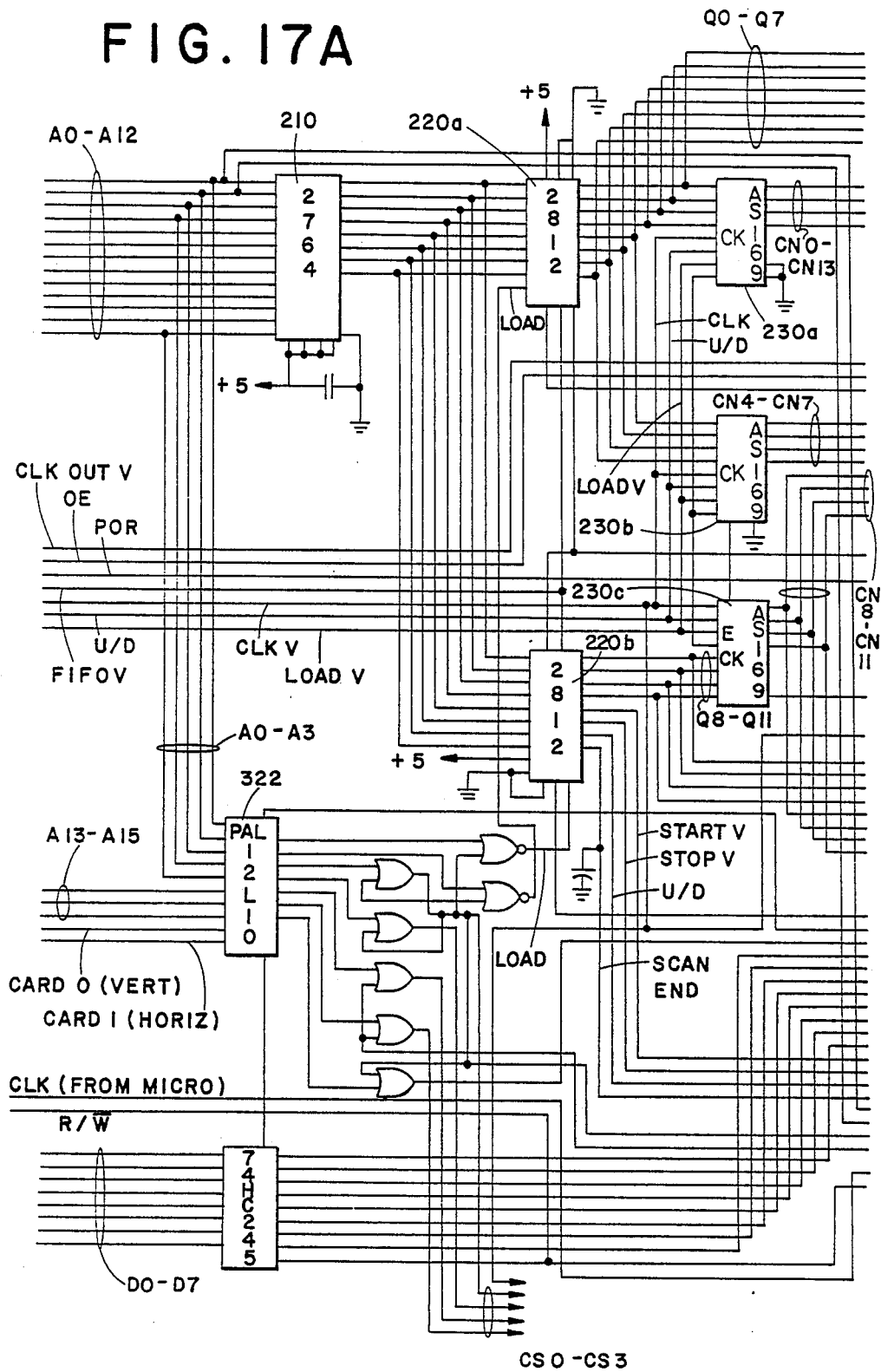

The PROM memory 210 is shown in FIG. 17A coupled to the address bus. The vertical PROM 210 is depicted and it is appreciated that a similar PROM 212 for generating horizontal scan voltages is included in the circuit 135. An eight bit output from the PROM memory 210 is coupled to two FIFO buffer memories 220a, 220b. Since a chip select input to the memory 210 is always active after power up, the contents of the output depend on the address defined on lines A0-A12. To load the buffer memories with data from the PROM memory 210 an address decoder 322 interprets the address on the address bus and directs one or the other of the memories 220a, 220b to load data from an eight bit PROM 210 output. As noted above the PROM 210 stores approximately 4000 vector designations. By alternating data transfer to the two memories 220a, 220b a 16 bit FIFO endpoint is stored in the memory 220. By changing PROMs, the scan pattern can be adjusted. Thus, to change from the FIG. 3 scan to the FIG. 7 scan requires that different PROMs be used. Alternately, the PROMs could be electronically erasable to allow their contents to be changed under microprocessor control.

The 32 word deep by 16 bit wide FIFO memory circuits 220a, 220b present output data organized as twelve bit vectors Q0-Q11 (FIG. 17A) and four additional bits END, START, STOP and U/D. The START and STOP bits are used to synchronize the beam monitor 142 with the beam scanning voltages and the U/D bit instructs the counter 230 whether to count up or down. The END bit indicates the end of each fine frame of 4000 vector signals for synchronization.

Figure 17B:
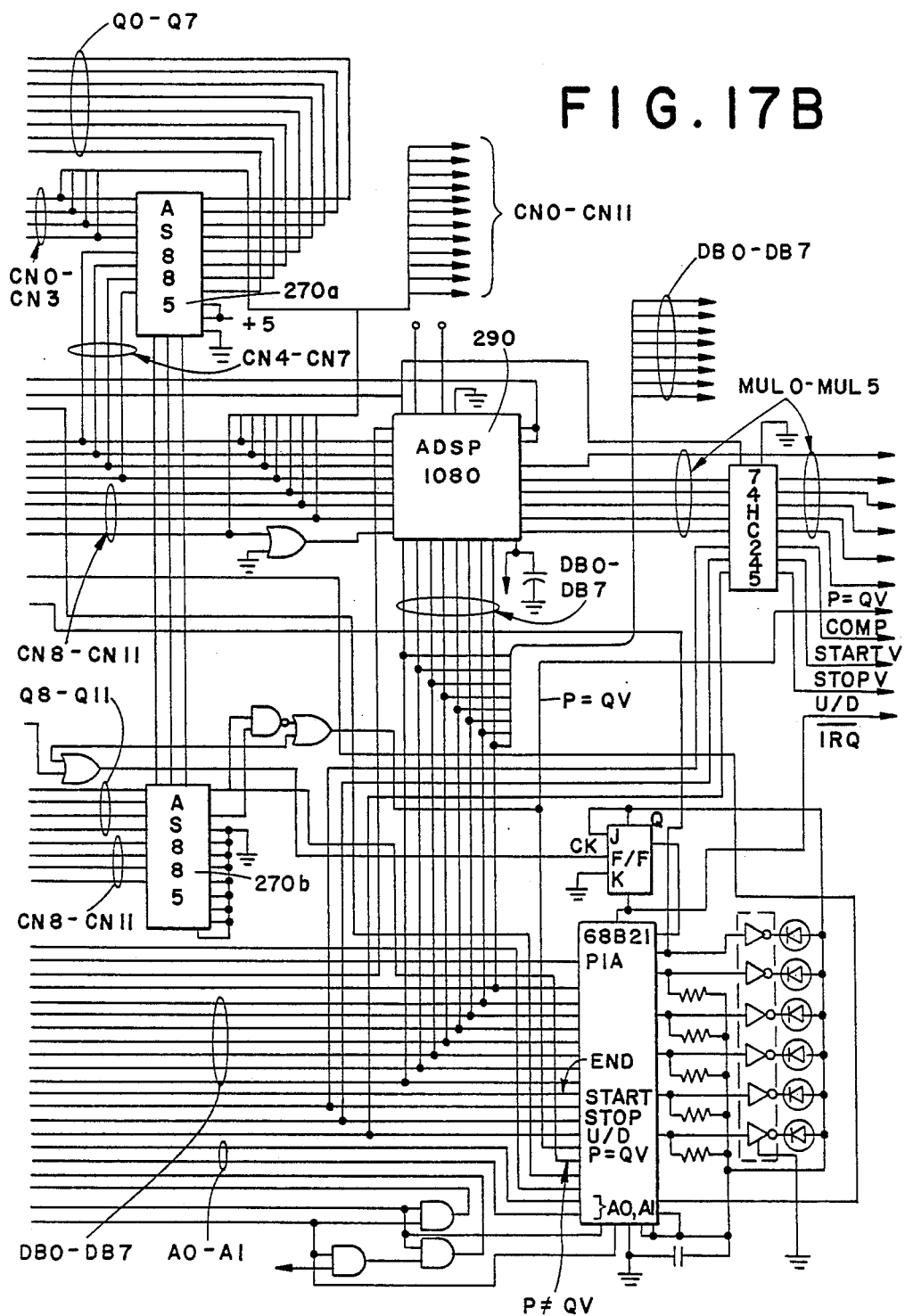

Three circuits 230a, 230b, 230c comprise the vertical voltage counter 230 and load vector data from the FIFO memory circuits 220a, 220b which advance data via control input FIFOV. The counter circuits are clocked at a uniform rate by a CLKV signal and present a 12 bit output CN0-CN11. As seen in FIG. 17B counter output signals CN0-CN11 are presented as inputs to two digital comparator circuits 270a, 270b. These two comparator circuits 270a, 270b also are coupled to the FIFO twelve bit vectors Q0-Q11 so that as the counter 230 is clocked toward a next scan beam vector end point the comparator 270 compares the counter value to the next FIFO vector value. When the two are the same the control output labeled P=QV changes state. This output is transmitted to the timing or clock circuit 137 which generates a FIFOV signal to clock a next vector data valve from the FIFO memory 220. This clocks both the vertical scan FIFO memory 220 of FIG. 17A and the horizontal FIFO memory 222. Each vector in the FIFO may activate the STARTV or the STOPV bit which is used to coordinate the monitor 142. It is seen in FIG. 6 that every fourth vector signals the beginning of a voltage increase in the waveform. A counter on the display circuit monitors this signal and upon receipt of seven start V signals knows that 28 of the 32 words stored in the FIFO have been used and that the FIFO must be reloaded by reading the next 28 vectors from the EPROM memory 210.

The high order eight counter output bits CN4-CN11 coupled to the scaling or multiplying circuit 290 (FIG. 17B). A scaling factor is latched into the scaling circuit 290 from the data bus connections DB0-DB7. A six bit scale factor output MUL0-MUL5 represents one index to the dose correction look-up table 280. This six bit output represents the high six bits of the 16 bit product of the high 8 bits of the count multiplied by the 8 bit scaling factor. These six bits represent an instantaneous vertical beam deflection as indicated by the output of the counter 230.

Figure 19:
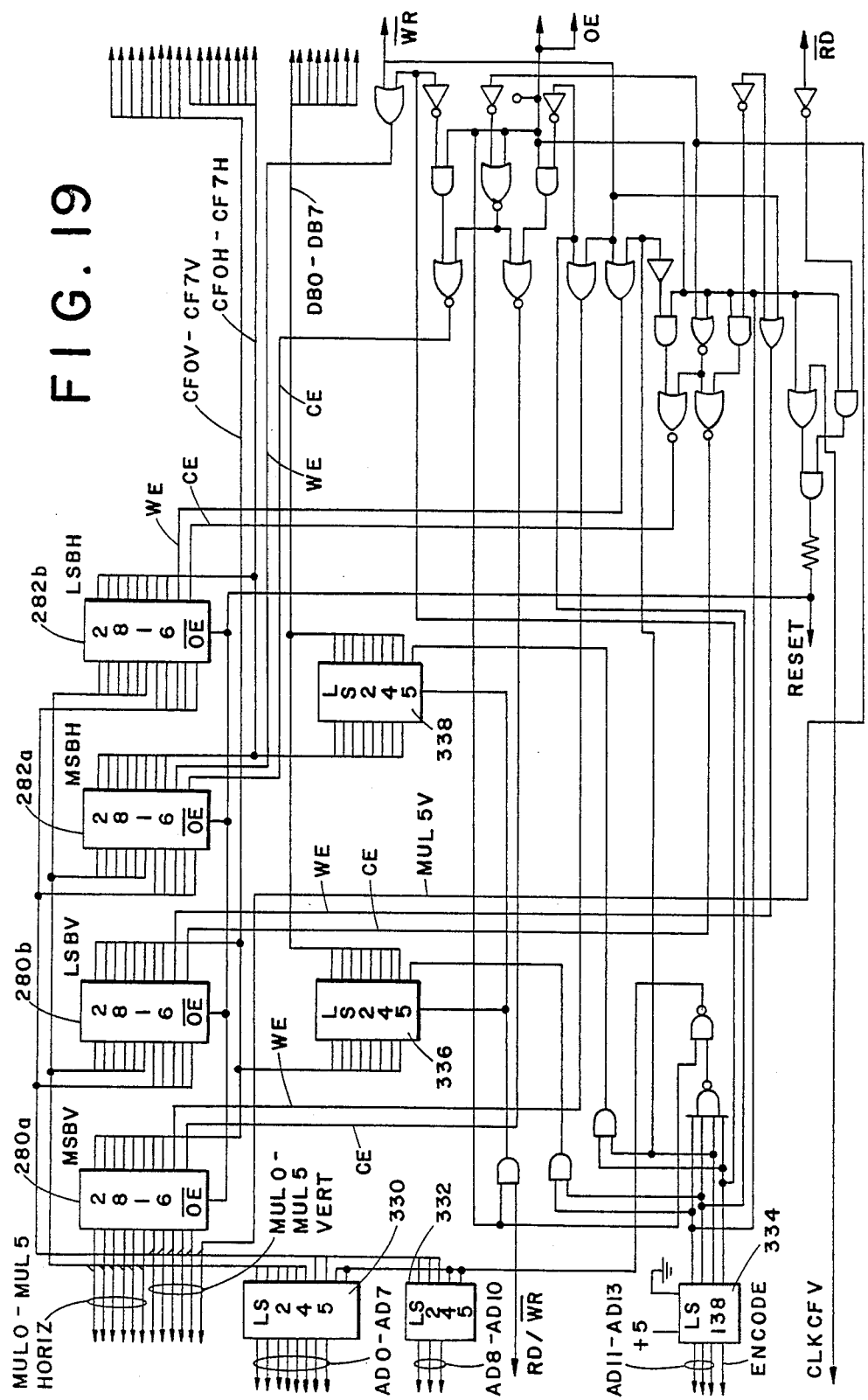

Memory circuits 280a, 280b, 282a, 282b forming the look-up tables 280, 282 are shown in FIG. 19. Six bit inputs MUL0-MUL5 (vertical) and MUL0-MUL5 (horizontal) index into these circuits to determine two eight bit correction factor outputs CF0V-CF7V (vertical correction factor) and CF0H-CF7H (horizontal correction factor). The circuits are electronically erasable read only memories having write enable (WE) and chip enable (CE) controls. When correction doses are programmed into the look-up tables 280, 282 latch circuits 330, 332, 334, 336, 338 access data from the address and data buses. Correction factors are presented on the data bus and the address bus indicates where the data is to be stored in the look-up table. Address decoder circuits 330, 332, 334 control by the OE, WR, and RD inputs to FIG. 19 the writing of data from the data bus DB0-DB7 into the look-up tables.

Figure 18A:
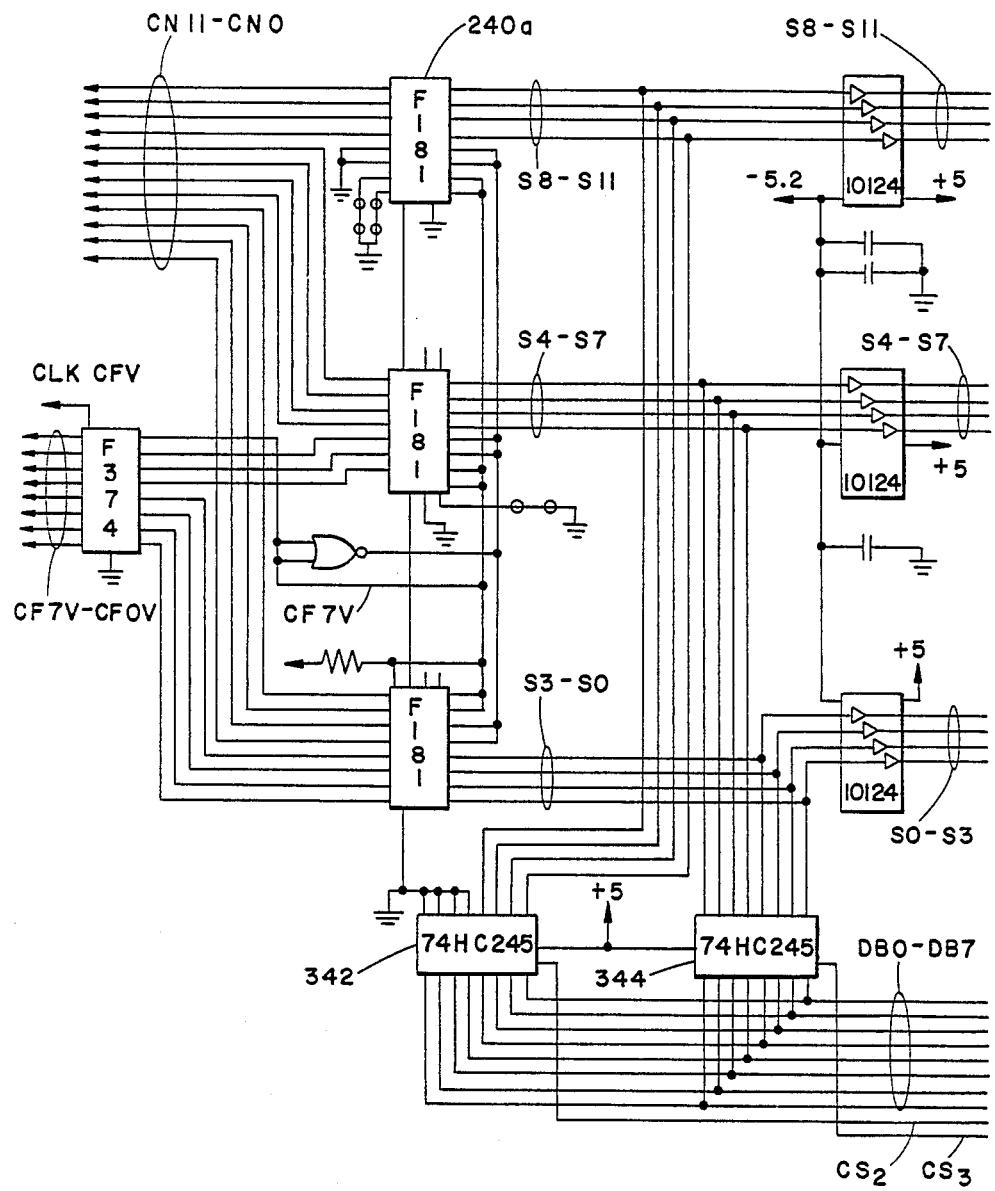

The digital adder 240 used to modify the counter output with a dose correction factor from the look-up table 280 is seen in FIG. 18A to comprise three circuits 240a, 240b, 240c. The adder 240 adds the counter output CN0-CN11 to the correction factor signal CF0V-CF7V to produce a digital scan output S0-S11. The correction factor is stored in the look-up table in sign and magnitude form with the eighth bit CF7V indicating whether the correction factor is positive or negative and is used as a control (add or subtract) for the adder circuits 240a, 240b, 240c. The maximum modification to the count is therefore 127 ($2^7-1$) and when combined with a counter output ranging up to 4095 ($2^{12}-1$) produces a change in beam sweep of up to 3%.

Figure 18B:
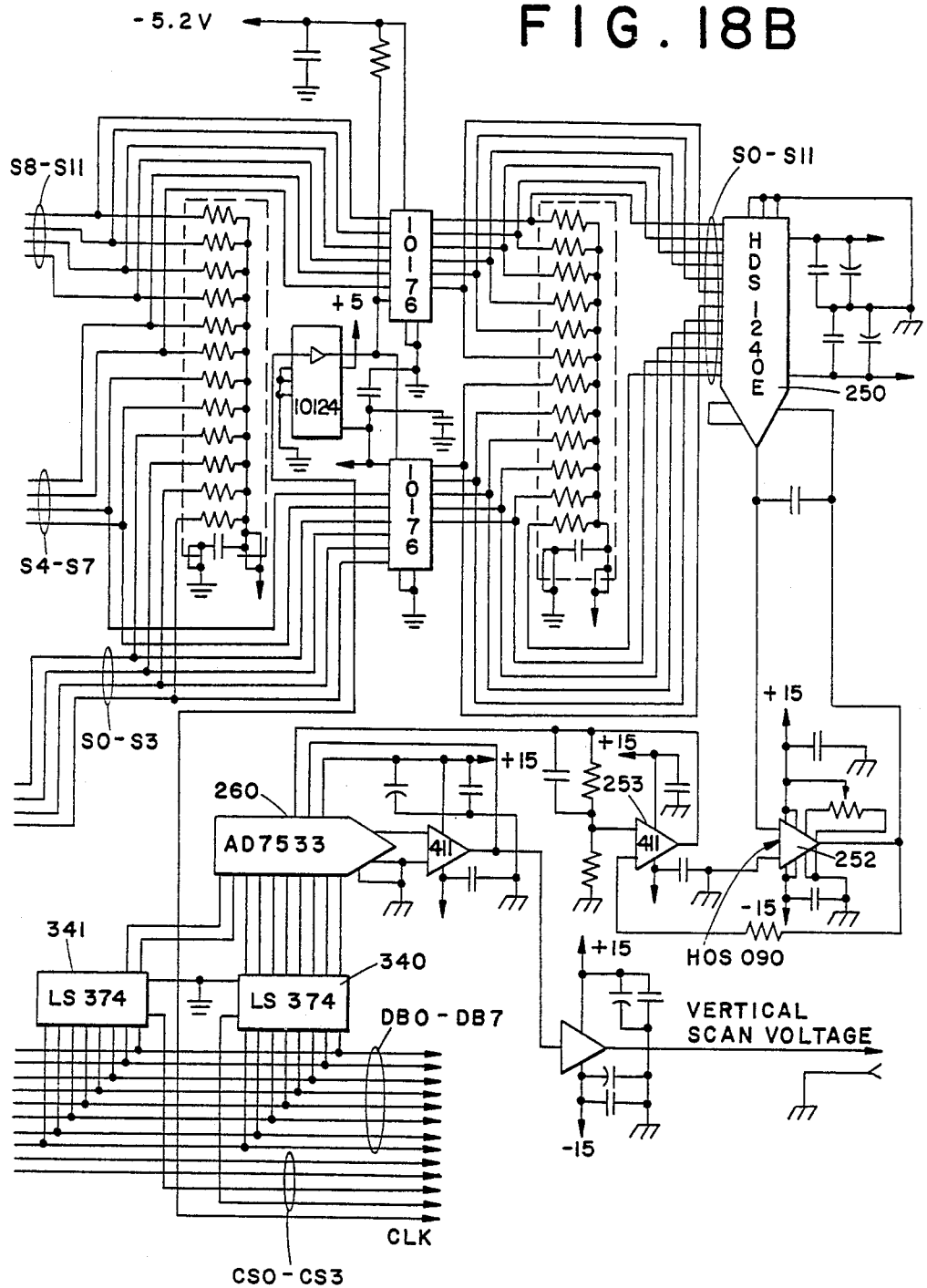

The circuitry of FIG. 18B transforms the digital scan signals S0-S11 into a low voltage analog output for energizing the vertical scanning electrodes. This low voltage signal is converted to a high voltage, time varying signal by the interface 214 of FIG. 10.

The digital-to-analog converter 250 generates an analog output which is buffered by an amplifier 253 and provided to the scaling circuit 260. The scaling circuit attenuates the output based upon a 10 bit scaling factor presented to the data bus DB0-DB7 by the microprocessor 300. The attenuation factor is latched into buffers 340, 341 by chip select control signals CS0, CS1. Other buffers 342, 344 coupled to the data bus DB0-DB7 allow the voltage scan outputs S0-S11 to be presented to the data bus for diagnosis of the scan generator.

As noted above, the memory 210 stores vectors defining approximately 4000 scan positions constituting a fine frame. Hundreds of fine frames are performed in sequence to complete an ion implantation. When the END bit is sensed the fine frame is complete and the scan generator recycles to the beginning of the vector sequence. As these hundreds of fine frames are being performed, a dither voltage 350 (FIG. 10) is applied to the vertical deflection voltage power supply 216. This dither voltage moves the fine frame up and down to make the ion dose more uniform by smearing the scan pattern across the wafer The time period $T_1$ of each dither segment is long compared to the fine frame period. $V_1$ the dither step voltage steps the pattern a fraction of the fine frame pitch spacing.

It is to be understood that the description of this embodiment of the invention is intended to be illustrative, rather than exhaustive, of the invention. Those of ordinary skill in the relevant art will be able to make certain additions, deletions and modifications to the described embodiment of the invention, as described in the following claims.

I claim:

1. An ion beam implant system for controllably treating a workpiece comprising:
    (a) source means for providing ions to treat the workpiece;
    (b) support means for orienting the workpiece at a location relative to the source means;
    (c) beam forming means for shaping said ions into an ion beam moving in a first trajectory to cause said ion beam to impinge upon a region of said workpiece;
    (d) scanning means for bending said ion beam away from said first trajectory to impinge upon other regions of said workpiece; said scanning means including one or more field creating electrodes; and
    (e) control means having an output coupled to said one or more field creating electrodes to apply control voltages to said electrodes; said control means including:
        (i) storage means to store a plurality of deflection signals corresponding to a position of a plurality of vertices in an ion beam scan pattern for controllably implanting said workpiece;
        (ii) conversion means for sequentially converting the deflection signals stored in the storage means to a time varying voltage output coupled to said scanning means for causing said ion beam to scan across the workpiece from a position of one vertex to a next subsequent vertex; and
        (iii) compensation means for adjusting the time varying voltage applied to the scanning means to control the instantaneous ion dose between vertices as said beam scans across said workpiece.

2. The apparatus of claim 1 wherein the scanning means comprises first electrode means for deflecting the ion beam in a first direction and second electrode means for deflecting the ion beam in a second direction orthogonal to said first direction, and further wherein the storage means stores multiple sets of signal pairs representing voltages that are applied to the first and second electrode means in a timed sequence under control of the conversion means.

3. The apparatus of claim 2 wherein the conversion means comprises:

first counter means for incrementing or decrementing a first counter value;
second counter means for incrementing or decrementing a second counter value;
timing means to initialize said first and second counters with signal pairs stored in said storage means and for incrementing or decrementing said counters toward a next succeeding pair of said signal pairs;
comparator means to compare the count of one of said counters with a next succeeding end point and initiate a next count sequence of both said first and second counter means; and
analog output means to convert a count of said counters to scan voltages coupled to said first and second electrode means as the timing means increments or decrements said first and second counters.

4. The apparatus of claim 3 where the compensation means comprises first and second digital summing circuits interposed between the first and second counter means and said analog output means to modify the count prior to conversion to said scan voltages.

5. The apparatus of claim 4 wherein the compensation means further comprises a first and second compensation memory means having values stored in memory locations, each said compensation memory means including an input relating to an instantaneous beam position on the workpiece and an output coupled to a digital summing circuit to be added or subtracted from the count of said first or second counters.

6. The apparatus of claim 1 wherein the compensation means includes means to varying the speed said means scans said beam across said workpiece as a function of the position of said beam on said workpiece.

7. The apparatus of claim 6 wherein the support means orients said workpiece to cause said ion beam to impinge upon the workpiece at a non-perpendicular angle.

8. The apparatus of claim 5 wherein the contents of the compensation memory means is adjustable to produce a controlled implantation variation across the surface of said workpiece.

9. A method for uniform ion beam treatment of a generally circular workpiece comprising the steps of:
    storing a series of coordinate signals having magnitudes representing relative positions of a series of vertices spaced with respect to the workpiece and defining a two dimensional ion beam scanning pattern;
    directing an ion beam toward a central location on the circular workpiece along an initial trajectory;
    deflecting the ion beam away from the initial trajectory to a first vertex of the series of vertices by converting a first signal in the series of coordinate signals into first and second deflection voltages and coupling said first and second deflection voltages to two scanning electrodes to deflect said beam away from the initial trajectory to said first vertex;
    varying the first and second deflection voltages at controlled rates to cause the ion beam to scan across the workpiece toward subsequent vertices in the beam scanning pattern by comparing a signal related to the deflection voltages to subsequent coordinate signals and causing a transition of at least one of said first and second deflection voltages as said beam reaches each vertex in said scanning pattern.

10. The method of claim 9 wherein the first and second deflection voltages are sawtooth waveforms that increase and decrease at a relatively uniform rate at slightly different frequencies.

11. The method of claim 9 additionally including the step of perturbing the first and second deflection voltages to raise or lower an instantaneous ion beam scan velocity across said workpiece.

12. The method of claim 9 wherein the first and second deflection voltages deflect the ion beam in generally orthogonal directions and wherein said first and second deflection voltages are varied at the same rate.

13. The method of claim 12 wherein the step of causing a transition of at least one of said first and second deflection voltages causes the ion beam to traverse beam paths that are perpendicular and cause said ion beam to sweep out a succession of rectangular scan patterns that overlap the workpiece.

14. Apparatus for ion beam treatment of a generally circular workpiece comprising:
   means for storing a series of coordinate signals having magnitudes representing relative positions of a series of vertices in a two dimensional ion beam scanning pattern;
   means for directing an ion beam toward a central location on the circular workpiece along an initial trajectory;
   means for deflecting the ion beam away from the initial trajectory to scan across the surface of said workpiece;
   means for converting coordinate signals representing the positions of the vertices into first and second deflection voltages and coupling said first and second deflection voltages to the means for deflecting to deflect said beam away from the initial trajectory to said series of vertices;
   means for varying the first and second deflection voltages at controlled rates to cause the ion beam to scan across the workpiece toward a next subsequent vertex in the beam scanning pattern; and
   means for comparing a signal related to the deflection voltages to a next subsequent coordinate signal and causing a transition of one of said first and second deflection voltages as the ion beam reaches each subsequent vertex to cause the ion beam to sweep out the ion beam scanning pattern.

15. The apparatus of claim 14 wherein the means for varying comprises a counter for each deflection voltage, the means for converting comprises a digital to analog converter coupled to an output of the counter and the means for comparing comprises a digital comparator to compare an output from the counter with the coordinate signal representing a next subsequent vertex in the series of vertices.

16. The apparatus of claim 15 additionally comprising compensation means interposed between a counter output and the digital to analog converter to modify the counter output and adjust the speed of said ion beam as said beam sweeps across the workpiece.

17. The apparatus of claim 16 wherein the compensation means comprises a digital store coupled to a counter output to adjust the speed of the ion beam based upon the instantaneous beam positioned on the workpiece as indicated by the counter output.

* * * * *